US008177991B2

(12) United States Patent
Lüssem et al.

(10) Patent No.: US 8,177,991 B2
(45) Date of Patent: May 15, 2012

(54) METHOD OF APPLYING A PATTERN OF METAL, METAL OXIDE AND/OR SEMICONDUCTOR MATERIAL ON A SUBSTRATE

(75) Inventors: Björn Lüssem, Dresden (DE); Zoi Karipidou, Stuttgart (DE); Jurina Wessels, Starnberg (DE); Akio Yasuda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/341,293

(22) Filed: Dec. 22, 2008

(65) Prior Publication Data
US 2009/0214838 A1 Aug. 27, 2009

(30) Foreign Application Priority Data
Feb. 25, 2008 (EP) .................................. 08003394

(51) Int. Cl.
*C03C 25/68* (2006.01)
*H01B 13/00* (2006.01)
*B44C 1/165* (2006.01)
(52) U.S. Cl. ............................. 216/54; 216/13; 156/230
(58) Field of Classification Search .............. 257/40, 257/59; 438/209; 216/13, 4, 54; 156/230, 156/150
See application file for complete search history.

(56) References Cited

U.S. PATENT DOCUMENTS

| 7,494,926 B2 * | 2/2009 | Kim et al. ..................... 438/677 |
| 2002/0171090 A1 * | 11/2002 | Oohata et al. .................. 257/88 |
| 2003/0175427 A1 | 9/2003 | Loo et al. |
| 2003/0178316 A1 * | 9/2003 | Jacobs et al. ................. 205/157 |
| 2006/0019076 A1 | 1/2006 | Kim et al. |
| 2006/0038182 A1 * | 2/2006 | Rogers et al. .................... 257/77 |
| 2006/0189160 A1 * | 8/2006 | Hattori et al. .................. 438/780 |
| 2007/0090446 A1 * | 4/2007 | Tamura ........................ 257/315 |
| 2008/0241491 A1 | 10/2008 | Wessels et al. |

FOREIGN PATENT DOCUMENTS

| EP | 1 688 790 A2 | 8/2006 |
| EP | 1 840 648 A1 | 10/2007 |
| JP | 2004-306412 | 11/2004 |

OTHER PUBLICATIONS

Shimizu, Ken T.; Fabbri, Jason D.; Jelincic, Jim J.; Melosh, Nicholas A. Soft Deposition of Large-Area Metal Contacts for Molecular Electronics. Advanced Materials. 2006, p. 1499-1504.*
Material Safety Data Sheet, C4F8, Mar. 19, 2003, Matheson Tri-Gas, Inc. p. 1-6.*
Shimizu, Ken T.; Fabbri, Jason D.; Jelincic, Jim J.; Melosh, Nicholas A.; Soft Deposition of Large-Area Metal Contacts for Molecular Electronics. Advanced Materials, vol. 18, Issue 12, p. 1499-1504. May 10, 2006.*
Yueh-Lin Loo, et al., "High-resolution transfer printing on GaAs surfaces using alkane dithiol monolayers", J. Vac. Sci Technol. B, XP012009646, vol. 20, No. 6, Nov. 1, 2002, pp. 2853-2856.

* cited by examiner

*Primary Examiner* — Shamim Ahmed
*Assistant Examiner* — Bradford Gates
(74) *Attorney, Agent, or Firm* — Oblon, Spivak, McClelland, Maier & Neustadt, L.L.P.

(57) ABSTRACT

The present application relates to a method of applying a pattern of metal, metal oxide and/or semiconductor material on a substrate, to a pattern created by such method and to uses of such pattern. Furthermore, the present invention relates to an assembly of layers that can be used for printing.

37 Claims, 14 Drawing Sheets

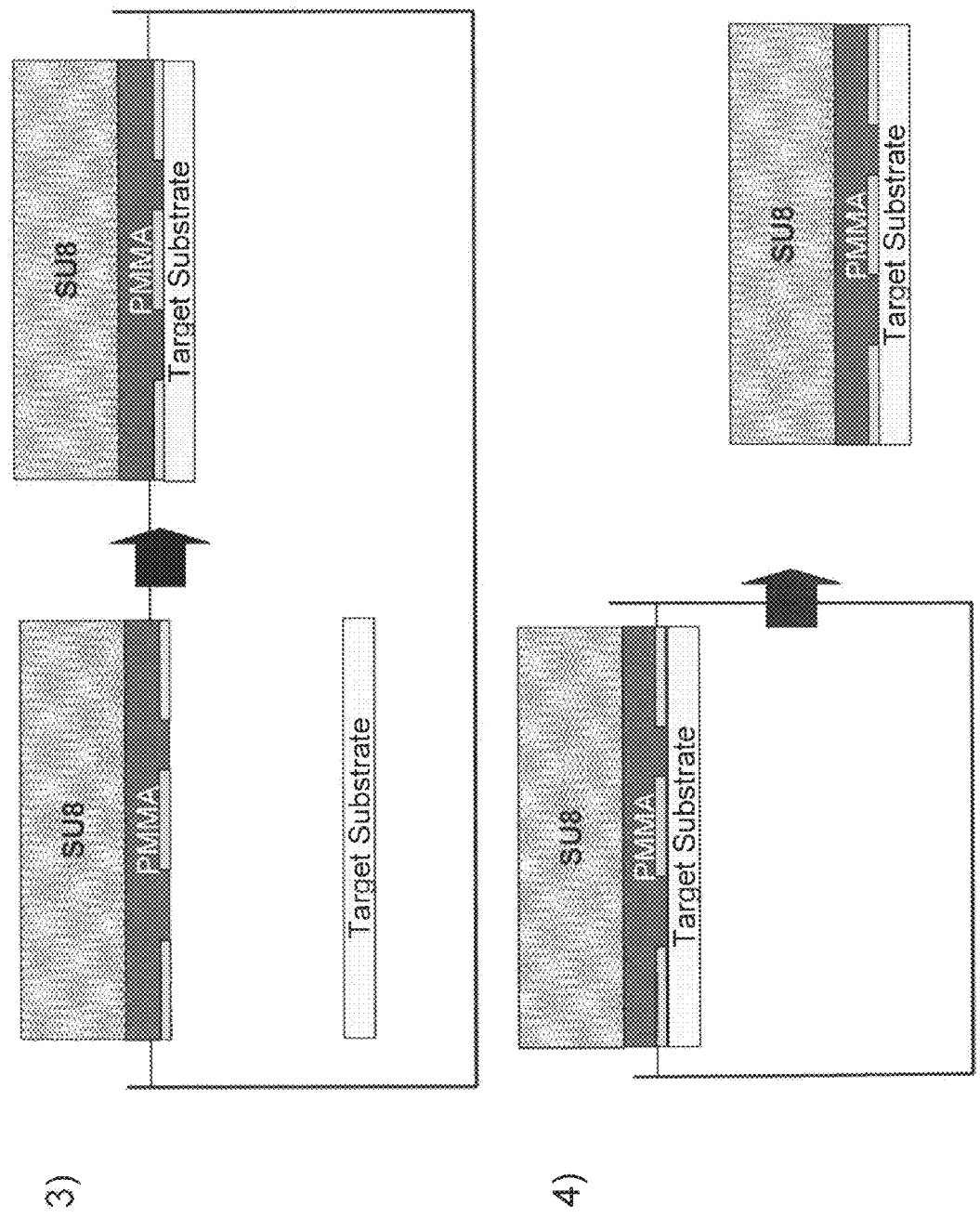
Figure 4a - continued

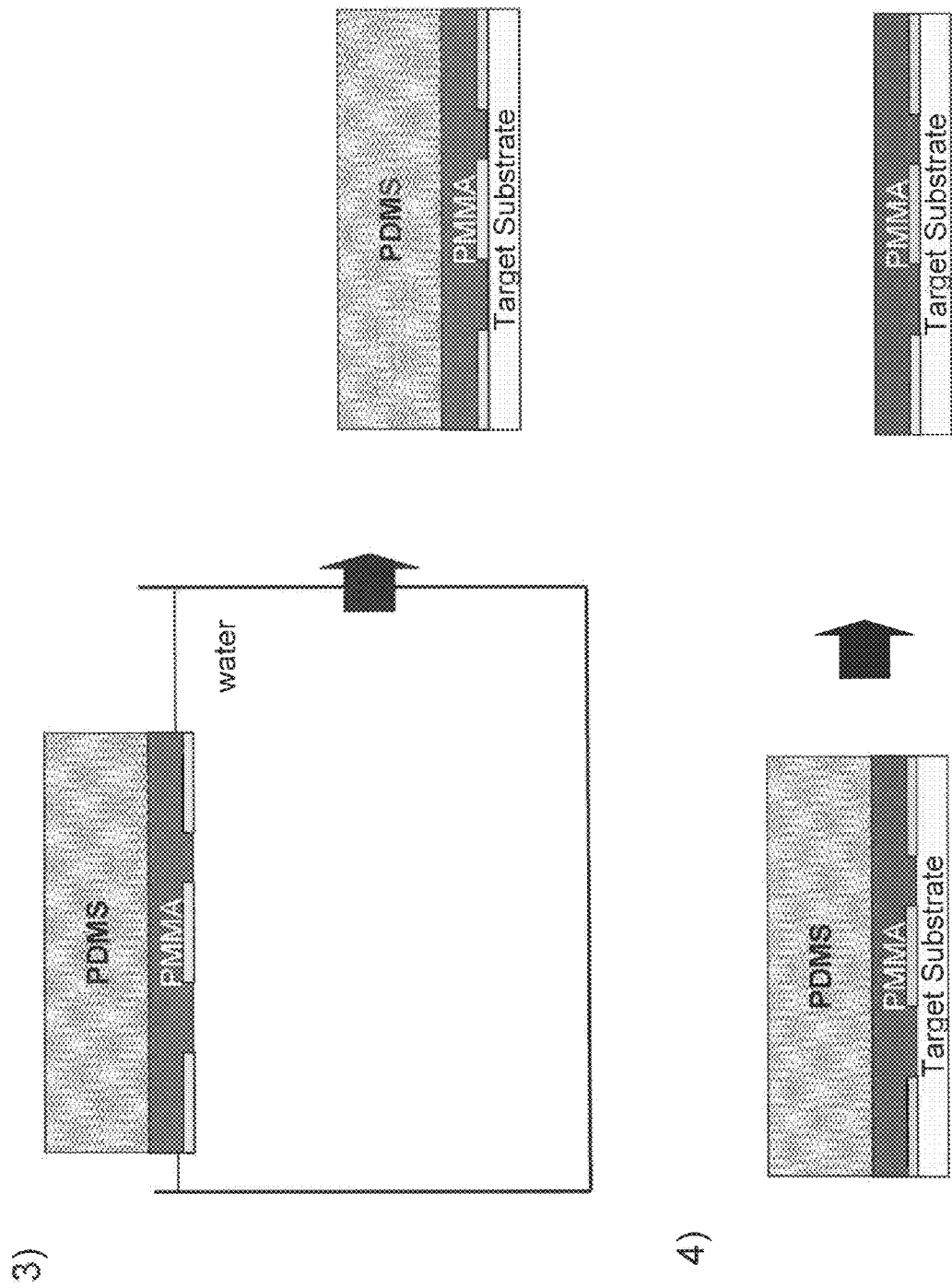
Figure 7 - continued

Electrodes printed onto PEN

Electrodes printed onto PES

METHOD OF APPLYING A PATTERN OF METAL, METAL OXIDE AND/OR SEMICONDUCTOR MATERIAL ON A SUBSTRATE

The present application relates to a method of applying a pattern of metal, metal oxide and/or semiconductor material on a substrate, to a pattern created by such method and to uses of such pattern. Furthermore, the present invention relates to an assembly of layers that can be used for printing.

BACKGROUND

During the past decade, soft lithography has developed to a versatile technique for fabricating micro- and nanostructured surfaces[1;2]. Among several techniques known collectively as soft lithography, micro contact printing (µCP) has become the most commonly used method[1]. The technique initially developed for the transfer of molecules was later applied for the transfer of metals[3] in the form of nanotransfer printing (nTP)[4-6] and soft-contact lamination (ScL)[7].

Nanotransfer printing and soft-contact lamination are both schematically depicted in FIG. 1. In case of nTP (FIG. 1a), a thin layer of metal is evaporated onto a patterned elastomeric stamp, which has been fabricated by drop casting of polydimethylsiloxane (PDMS) onto a patterned Si wafer. The evaporated metal layer is brought into conformal contact with an organic layer on the substrate. As a result of the chemical bond formation at the metal/organic interface, the metal layer is transferred from the PDMS stamp onto the organic layer. The process takes place under ambient conditions without application of any additional pressure. Using this process Au top electrodes in Au/alkanedithiol/GaAs hetero junctions[5] and Au/mercaptosilane/Si hetero junctions[8] were printed. In a slightly modified process, gold is patterned on silicon wafers and subsequently transferred to selected polymers at high pressures (100-400 psi) and temperatures ranging from 100 to 140° C.[9].

In case of ScL the metal-organic adhesion is based on van-der-Waals interactions and weaker than the metal-PDMS interaction. Thus, in this process the metal is not transferred from the PDMS onto the organic layer, but the PDMS remains on the Au layer and is part of the PDMS/metal/organic/substrate junction (FIG. 1b). The process takes place in ambient conditions without the application of any additional pressure[10].

Besides nTP and ScL, a printing technique called polymer assisted lift off (PALO) printing has been developed[11] recently (see FIG. 2). As for its predecessor, the lift-off/float-on technique[12], a metallic top electrode is deposited and patterned on a solid substrate. The electrodes are then covered by a thin layer of PMMA (Polymethyl methacrylate) and released from the substrate by shortly immersing them into KOH and acetic acid. The resulting PMMA foil with electrode structures underneath can finally be placed onto the final substrate, i.e. a molecular layer. However, this transfer of the electrode structures has to be done in a water bath, which does not allow for precise alignment between substrate and top electrode.

In addition to these printing techniques, a gentle process that is scalable down to critical dimensions of <50 nm has been developed by some of the present inventors[13] (European Patent Application No. 06 006 899.6, filed on Mar. 31, 2006). Patterned metal structures are defined on a solid substrate and transferred onto a polymer pad (FIG. 3a). Subsequently, these metal patterns can be transferred from the polymer pad onto other surfaces such as SiO2 (FIG. 3b).

For molecular electronics, the PALO technique has the advantage to be very soft and gentle, so that the molecular layer is not damaged during the deposition of the top electrode. However, PALO does not allow for a precise alignment of the pattern to be printed with the substrate and any structures thereon. For example if the pattern to be printed is a set of top electrodes, and these are to be printed onto a substrate on which there are already located bottom electrodes, some of the aforementioned techniques will prove difficult to achieve a precise alignment. Furthermore, the polymer assisted lift of (PALO) has proved to be rather difficult to reproduce in that the polymethyl methylacrylate foil is prone to breakage of foils and/or patterns. Furthermore the PALO technique relies on shortly immersing the substrate in KOH and acetic acid which may cause unwanted side reactions on the pattern to be printed. For example if the pattern to be printed is a metal pattern, the presence of KOH and acetic acid may cause oxidation reactions taking place on the metal and thereby contaminate the electrodes.

SUMMARY

Accordingly, it was an object of the present invention to provide for an improved method of applying a pattern of metal, metal oxide and/or semiconductor material on a substrate which is easy to perform and which allows an alignment of the pattern to be printed, if desired. Furthermore, it was an object of the present invention to provide for an improved method of applying a pattern on a substrate where the presence of corrosive agents, such as KOH or acetic acid is avoided. Furthermore, it was an object of the present invention to provide for a method of applying a pattern on a substrate, which method has a lower risk of breakage of the pattern during the transfer steps and which method is robust to perform.

All these objects are solved by a method of applying a pattern of metal, metal oxide and/or semiconductor material on a substrate, comprising the steps:

a) providing a first substrate having a surface,
b) coating said surface with a layer of water soluble material,
c) creating a pattern of metal, metal oxide and/or semiconductor material on said layer of water soluble material,
d) covering said pattern of metal, metal oxide and/or semiconductor material and said layer of water soluble material by a layer of polymeric material,
e) covering said layer of polymeric material by a support layer,
f) immersing said first substrate and the various layers on it, resulting from steps b)-e), in a bulk of water or in a bulk of aqueous solution until said layer of water soluble material is dissolved, such that an assembly consisting of said support layer, said layer of polymeric material and said pattern of metal, metal oxide and/or semiconductor material is detached from said first substrate,
g) bringing said pattern of metal, metal oxide and/or semiconductor material of said assembly in conformal contact with a second substrate, and optionally leaving it in contact for a defined period of time with said second substrate, said time being in the range of from 10 s to 48 h, thereby applying said pattern of metal, metal oxide and/or semiconductor material with the layer of polymeric material on it onto said second substrate.

In one embodiment, the method according to the present invention further comprises the step:

h) removing said support layer from said layer of polymeric material, wherein, preferably, the method further comprises the step:

i) removing said layer of polymeric material.

In one embodiment, said polymeric material is selected from the group comprising polyesters of carboxylic acids, polyanhydrides of carboxylic acids, polycarbonates and mixtures of any of the foregoing.

Preferably said polymeric material is selected from the group comprising polymethylmethacrylate (PMMA), polyethylene terephthalate, cellulose acetate and poly(oxycarbonyloxo-1,4-phenylene-isopropylidene-1,4-phenylene)(polycarbonate).

Preferably said polymeric material is polymethylmethacrylate (PMMA).

In one embodiment, said water soluble material is selected from the group comprising polyacrylic acid, polyvinyl alcohol and polyacrylamide.

In one embodiment, step c) is performed by optical lithography, nano-imprint lithography, UV nano-imprint lithography, e-beam lithography, or soft lithography, wherein, preferably, step c) is performed by optical lithography.

In one embodiment, step c) is performed by the following sequence of substeps:
ca) applying a layer of metal, metal oxide and/or semiconductor material on said layer of a water soluble material,
cb) creating a resist pattern on said layer of metal, metal oxide and/or semiconductor material,
cc) removing said layer of metal, metal oxide and/or semiconductor material in positions which are not covered by said resist pattern, by means of an etching technique, and, optionally,
cd) removing said resist pattern to leave behind a pattern of metal, metal oxide and/or semiconductor material on said layer of water soluble material.

In one embodiment, step f) is performed by placing said first substrate and the various layers on it, resulting from steps b)-e), in said bulk of water or said bulk of aqueous solution and soaking it for a period of from 1 s to 3 h, preferably from 1 min to 30 min, more preferably from 5 min to 25 min, preferably at a temperature in the range of from 10° C. to 90° C.

In one embodiment, said support layer is made of a resist material, preferably selected from photoresists, such as epoxy based photoresists.

Preferably, step g) is performed by placing said second substrate in said bulk of water or said bulk of aqueous solution and bringing said pattern of metal, metal oxide and/or semiconductor material in conformal contact with said second substrate in said bulk of water or said bulk of aqueous solution, and optionally performing step h) by etching, preferably plasma etching Preferably, said support layer has a thickness of from 100 nm-10 µm, preferably from 1 µm-2 µm.

Preferably, said second substrate has a curved or bent surface or a surface with an edge and is covered with a structured bottom electrode and a layer of organic material, onto which surface said pattern of metal, metal oxide and/or semiconductor material is to be applied.

In another embodiment, said support layer is made of a polymeric material selected from polydimethyl siloxane (PDMS), polyolefinic plastic (POP) and ionomeric polymers, such as surlyn®, wherein, preferably, step g) is performed by removing said assembly resulting from step f) out of said bulk of water or said bulk of aqueous solution and bringing said pattern of metal, metal oxide and/or semiconductor material in conformal contact with said second substrate, wherein, more preferably, in step g), said pattern of metal, metal oxide and/or semiconductor material is aligned with said second substrate before and/or while bringing it in conformal contact with said second substrate, wherein, preferably, said alignment is achieved using marker patterns or moiré patterns on said second substrate and said layer of polymeric material and said alignment is achieved using an alignment apparatus.

In the embodiment, wherein said support layer is made of a polymeric material, step h) is performed by drying said pattern of metal, metal oxide and/or semiconductor material applied in step g) for a defined period of time, said time being in the range of from 10 s to 48 h, and thereafter peeling off said support layer from said layer of polymeric material, wherein, preferably, step i) is performed by etching, preferably oxygen plasma etching.

In one embodiment, said support layer has a thickness of 500 µm-10 mm, preferably 1 mm-5 mm, more preferably 1 mm-3 mm.

In one embodiment, said layer of water soluble material has a thickness in the range of from 10 nm to 1 µm, preferably 100 nm to 500 nm, more preferably from 200 nm to 450 nm, and even more preferably 300 nm to 400 nm.

In one embodiment, said layer of polymeric material has a thickness in the range of from 20 nm to 1 µm, preferably 100 nm to 500 nm, more preferably 200 nm to 400 nm.

In one embodiment, said layer of metal, metal oxide and/or semiconductor material has a thickness in the range of from 1 nm to 500 nm, preferably 5 nm to 200 nm, more preferably 10 nm to 100 nm.

In one embodiment, said metal is selected from the group comprising Au, Ti, Pt, Ag, Cr, Cu, Al, and said metal oxide is selected from the group comprising $Al_2O_3$, AgO, $TiO_2$, $SiO_2$, and said semiconductor material is selected from the group comprising Si, Ge, GaAs, GaN, InSb, InP, CdS, ZnSe.

In one embodiment, said first substrate is made of a material selected from the group comprising single crystalline materials, polycrystalline materials, materials such as GaAs, Si, $SiO_2$, mica, amorphous composites, such as glass and float glass, and perovskites.

In one embodiment, said first substrate is made of silicon.

In one embodiment, said metal is Au or Al.

In one embodiment, said second substrate is structured with bottom electrodes and has a molecular layer on a surface, and said pattern of metal, metal oxide and/or semiconductor material is applied on said surface in step g) of the method according to the present invention, wherein, preferably, said molecular layer is a layer of semiconducting organic molecules, polymers or a self-assembled monolayer.

DETAILED DESCRIPTION

The objects of the present invention are also solved by a pattern of metal, metal oxide and/or semiconductor material on a substrate, prepared by the method according to the present invention, wherein, preferably, said pattern is a pattern of electrodes.

The objects of the present invention are also solved by an assembly of layers comprising a pattern of metal, metal oxide and/or semiconductor material, a layer of polymeric material on it, and a support layer on said layer of polymeric material, said layers and said pattern of metal, metal oxide and/or semiconductor material being as defined above.

The objects of the present invention are also solved by the use of the pattern according to the present invention in an electronic device comprising at least a bottom electrode, a molecular layer and a top electrode, preferably as electrodes.

The objects of the present invention are also solved by the use of the assembly according to the present invention for printing a pattern of metal, metal oxide and/or semiconductor material on a surface, preferably in a roll-to-roll-printing process.

As used herein, the term "to bring a pattern of metal, metal oxide and/or semiconductor material in conformal contact with a substrate", is meant to denote any contact between said substrate and said pattern allowing the transfer of said pattern to said substrate. In some embodiments, exertion of pressure is needed for such transfer to occur, and in these instances, the term "to bring into conformal contact with" is to be equated with "to press on (to)".

Resists useful for the purposes of the present invention are well known to someone skilled in the art. Exemplary resists useful for the purposes of the present invention are photoresists, electron-beam resists, X-ray-resists, nano imprint resists etc. More specific examples of resists useful for the present invention are SU8® (photoresist), PMMA (electron-beam resist), AZ5214 (photo), NXR2010-3020 (nano-imprint) or others. In this application, sometimes reference is made to a "first substrate", and a "second substrate". The method according to the present invention, in its simplest form, aims at the transfer of a pattern of metal, metal oxide and/or semiconductor material from one substrate to another. In this sense, the "second substrate" may be considered as a "target substrate" onto which said pattern of metal, metal oxide, and/or semiconductor material is to be transferred.

The terms "to coat with" and "to cover by or with" are used interchangeably herein and are meant to be synonymous.

Coating or covering techniques are well known to someone skilled in the art and include spin casting, drop casting, doctor blading, Langmuir-Blodgett-techniques, physical vapor deposition and sputtering. These techniques are used herein to coat the first substrate with a layer of water soluble material or to apply a layer of polymeric material, e.g. PMMA on the layer of water soluble material or to cover the layer of polymeric material, e.g. PMMA by a support layer.

The term "support layer" is meant to denote any layer that provides stability and rigidity to the layer of polymeric material, e.g. the PMMA layer and the pattern of metal, metal oxide and/or semiconductor material. In principle, there are two possible preferred embodiments of these support layers which differ in their thickness. In one embodiment, the support layer has a thickness in the micrometer range, preferably 1-10 µm, in which case the transfer of the pattern of metal, metal oxide and/or semiconductor material in the bulk of water or aqueous solution. Upon dissolution of the layer of water soluble material, the support layer with the layer of polymeric material, e.g. a PMMA layer and the pattern of metal floats in the bulk of water and then can be put in contact with the second substrate.

In the other embodiment of the support layer, the support layer has a thickness in the millimeter range and is preferably made from a polymer, more preferably a flexible yet difficult to tear polymer. In this embodiment, the assembly of support layer, layer of polymeric material, e.g. PMMA layer and pattern may be actually taken out of the bulk of water or aqueous solution and may be used for printing in a dry environment. In this embodiment, a precise alignment of the pattern with the target substrate is possible. The inventors have improved the known PALO method by using a layer of water soluble material and using an additional support layer, thus obviating the need for corrosive agents for the printing process as well as providing additional rigidity and allowing for a precise alignment of the pattern with the underlying substrate. The layer of the water soluble material improves the liability of the detachment of the pattern foil significantly. The present invention allows that even large area foils can be released from the substrate. Furthermore, a use of corrosive agents such as acetic acid and KOH is avoided which corrosive agents would otherwise lead to contamination of the printed structures. Furthermore, the support layer increases the mechanical stability while still retaining the flexibility of the foil which allows for printing onto arbitrarily shaped surfaces, such as curved or bent substrates. Furthermore, in some embodiments of the support layer, the pattern to be printed can be removed from the bulk of water or aqueous solution which allows a precise alignment between the substrate and the pattern to be printed. In contrast to ScL the support layer may subsequently be removed such that also a direct access to the printed pattern is possible, for example if it is to be used as top electrodes.

One possible application of the method according to the present invention is to print a set of top-electrodes on a substrate. This embodiment is outlined as follows:

The final setup of the top-electrodes used in the method according to the present invention is shown in FIG. 4a. A silicon wafer is coated with a 300-400 nm thick layer of a water soluble material, e.g poly-acrylic-acid (PAA). On top of this water-soluble layer, electrodes (e.g. consisting of gold) are defined by optical lithography. Finally, the water-soluble layer and the gold electrodes are covered by a thin layer of PMMA (~300 nm) and SU8 (1-2 µm, epoxy based photoresist offered by e.g. Microchemical Corporation) by spin-coating.

Different process-steps are necessary to perform the optical lithography on top of the water-soluble layer (see FIG. 4b). At first, a thin gold layer (~10-100 nm thick) is deposited onto the water-soluble layer by thermal or e-beam evaporation. Next, resist structures are defined on top of the gold layer by optical lithography. Finally, the structure of the resist is transferred into the gold layer by a short dry-chemical etching step (etching in argon plasma for gold electrodes).

The whole setup as shown in FIG. 4a can be immersed into water. After a soaking period of 20-50 min, the water-soluble layer is dissolved and the electrodes, fixed by the polymeric layers on top, detach from the silicon substrate and spread out on the water surface. Finally, the target substrate is immersed into the water bath and the electrode foil is floated onto it.

The SU8 layer provides mechanical strength but still retains the flexibility of the foil. This allows for printing electrodes onto arbitrarily shaped surfaces (cf. FIG. 5). Furthermore, the printing method is very soft and therefore well suited for the deposition of top electrodes onto molecular layers. Optical images of crossbars consisting of gold bottom and top electrodes and of aluminium bottom and gold top electrodes are shown in FIGS. 6a and b, respectively. For both crossbars, a thin molecular layer consisting of a semi-conducting organic molecule is included between top and bottom electrode. The top-electrode is thus printed onto the molecular layer by the above mentioned process.

Using this printing protocol, the transfer of the top electrodes onto the target substrate takes place in a water bath. This is necessary since the electrode foil crumples and cannot be placed onto the target substrate if it is removed from the water surface. However, the transfer in water precludes precise alignment between the target substrate and the top-electrode.

To allow for an alignment between the target substrate and the top electrodes, the SU8 layer can be replaced by a 1-2 mm thick PDMS (Polydimethylsiloxane) layer (see FIG. 7). The PDMS layer provides further mechanical strength to the electrodes so that the electrodes can be taken out of the water bath without crumpling. Top electrodes and substrate can then be aligned in conventional fine-placers (e.g. fineplacer commercially available from FineTech). Such fine-placers are an example of an alignment apparatus by which two substrates can be aligned with respect to each other.

After printing of the top electrode and a short drying step (~5 h at room temperature) the PDMS foil can be peeled off from the PMMA layer. Direct access to the top electrodes can then be provided by etching the PMMA layer in $O_2$ plasma.

An image of a crossbar of gold top and bottom electrode with a molecular layer in between is shown in FIG. 8. The top electrode is printed onto the molecular layer outside the water bath using a thick PDMS layer.

Several variations of the processes described above are possible. Besides optical lithography, nano-imprint and e-beam lithography can be used. The PDMS layer can be replaced e.g. by poyloefinic plastics (POP) or Surlyn. The alignment between top and bottom electrodes can be accomplished by conventional markers or by moiré patterns on the masks that allow for an alignment precision of 100 nm and below[15].

The main application of this printing technique is the deposition of metallic electrodes onto molecular layers (e.g. layers consisting of semi-conducting organic molecules, layers of polymers or self-assembled monolayers, cf. FIGS. 6 and 8), but it can also be employed to print onto other, arbitrary shaped surfaces (cf. FIG. 5) or to print onto flexible substrates as for example PES or PEN (polyether sulfone and Polyethylennaphtalate) (cf. FIG. 9).

Furthermore, reference is made to the figures, wherein

FIG. 1 shows a schematic representation of the nano transfer printing process (nTP)(a) and the soft-contact lamination process (ScL)(b), FIG. 2 shows a schematic representation of the polymer assisted lift off (PALO) printing technique, using PMMA as the polymeric material, FIG. 3 shows the printing technique that has been described in European Patent Application No. 06 006 899.6, the content of which is enclosed in its entirety herein by reference thereto. Patterned metal structures are defined on a solid substrate and transferred onto a polymer pad (FIG. 3*a*), and subsequently, these metal patterns are transferred onto another substrate (FIG. 3*b*), and FIG. 4*a*, panel 1 shows a setup of the top-electrodes embedded in a layer of PMMA as polymeric material and covered by a water soluble layer, panel 2 shows a transfer of this setup into a bulk of water whereby the water soluble layer becomes dissolved and the assembly comprising the support layer, PMMA layer and pattern of metal, metal oxide and/or semiconductor material floats on the surface; in panel 3, a target substrate is brought into the bulk of water and brought in conformal contact with the pattern and, in panel 4, subsequently taken out of the bulk of water together with the pattern, PMMA layer and support layer on top;

FIG. 4*b* shows an example of how a metal pattern may be created on top of a water soluble layer, using optical lithography.

FIG. 6 shows that the printing method according to the present invention is extremely well suited for the deposition of top electrodes onto molecular layers; more specifically, FIGS. 6*a* and *b* show optical images of cross bars consisting of gold bottom and top electrodes (part a) and of aluminium bottom and gold top electrodes (part b) with a semi-conducting molecular layer in between;

FIG. 8 shows an image of a printed cross bar of gold top and bottom electrodes with a molecular layer in between;

Moreover reference is made to the following examples which are given to illustrate not to limit the present invention:

EXAMPLES

Figure 1A:
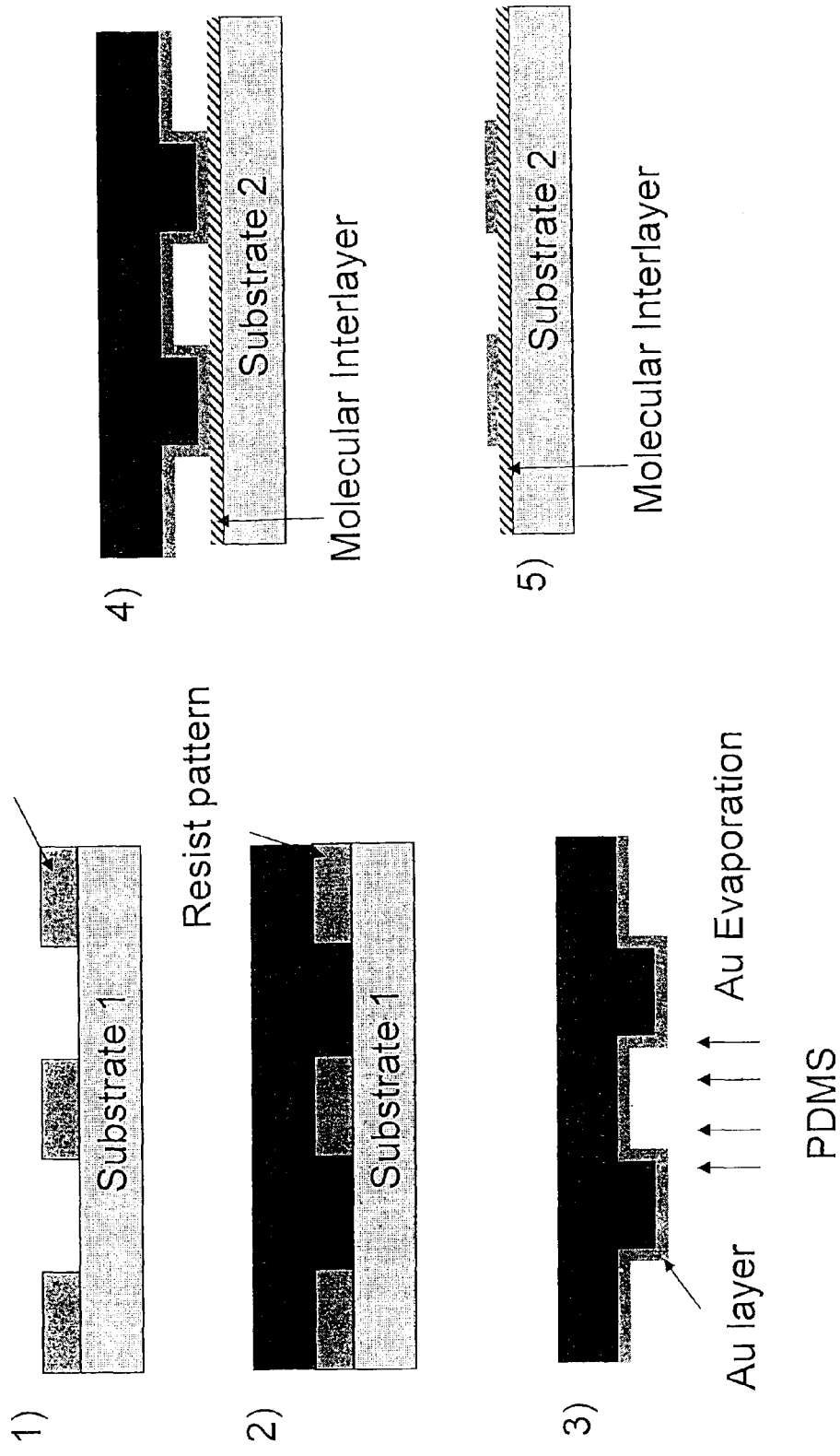
Figure 1B:
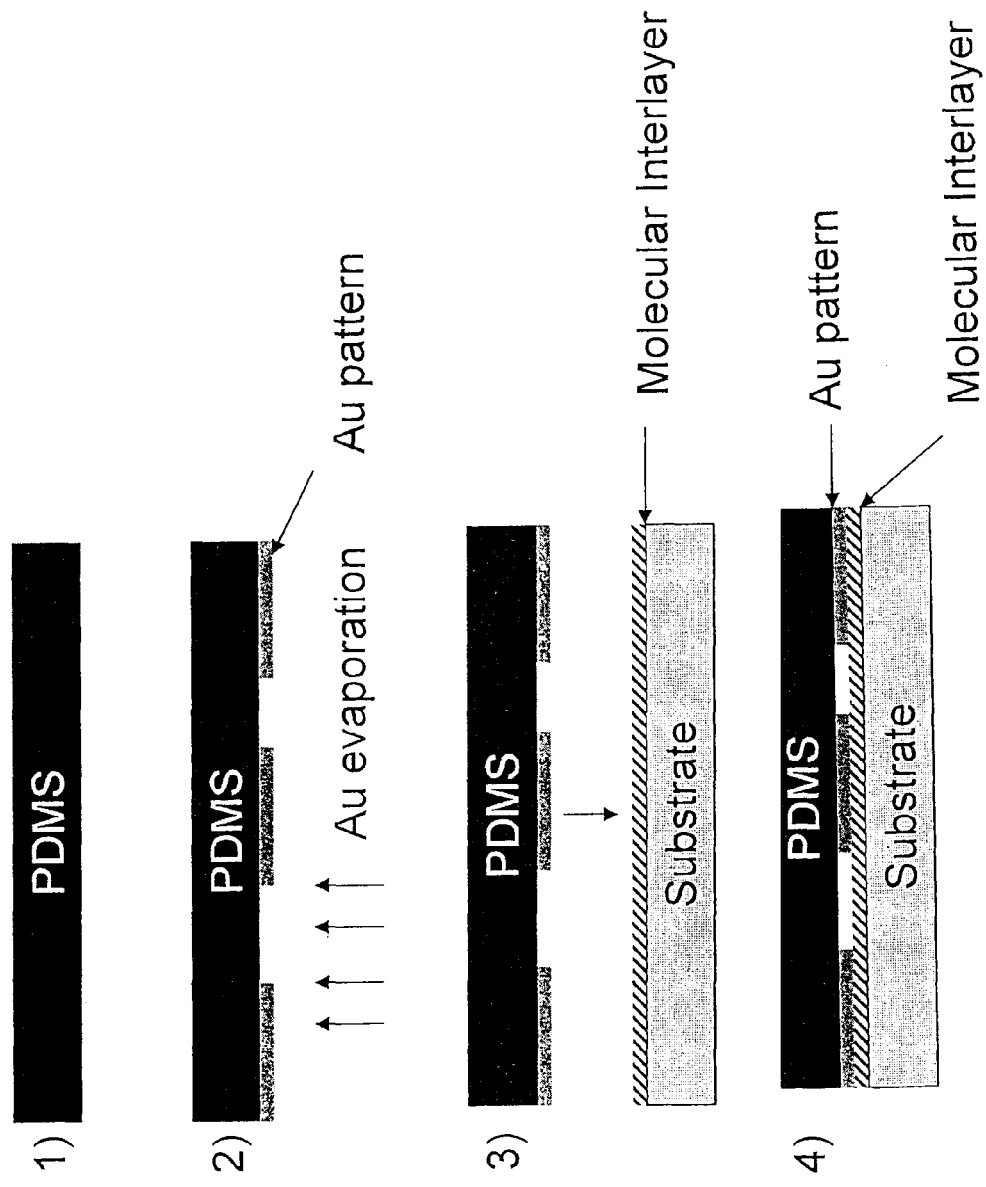
Figure 2:
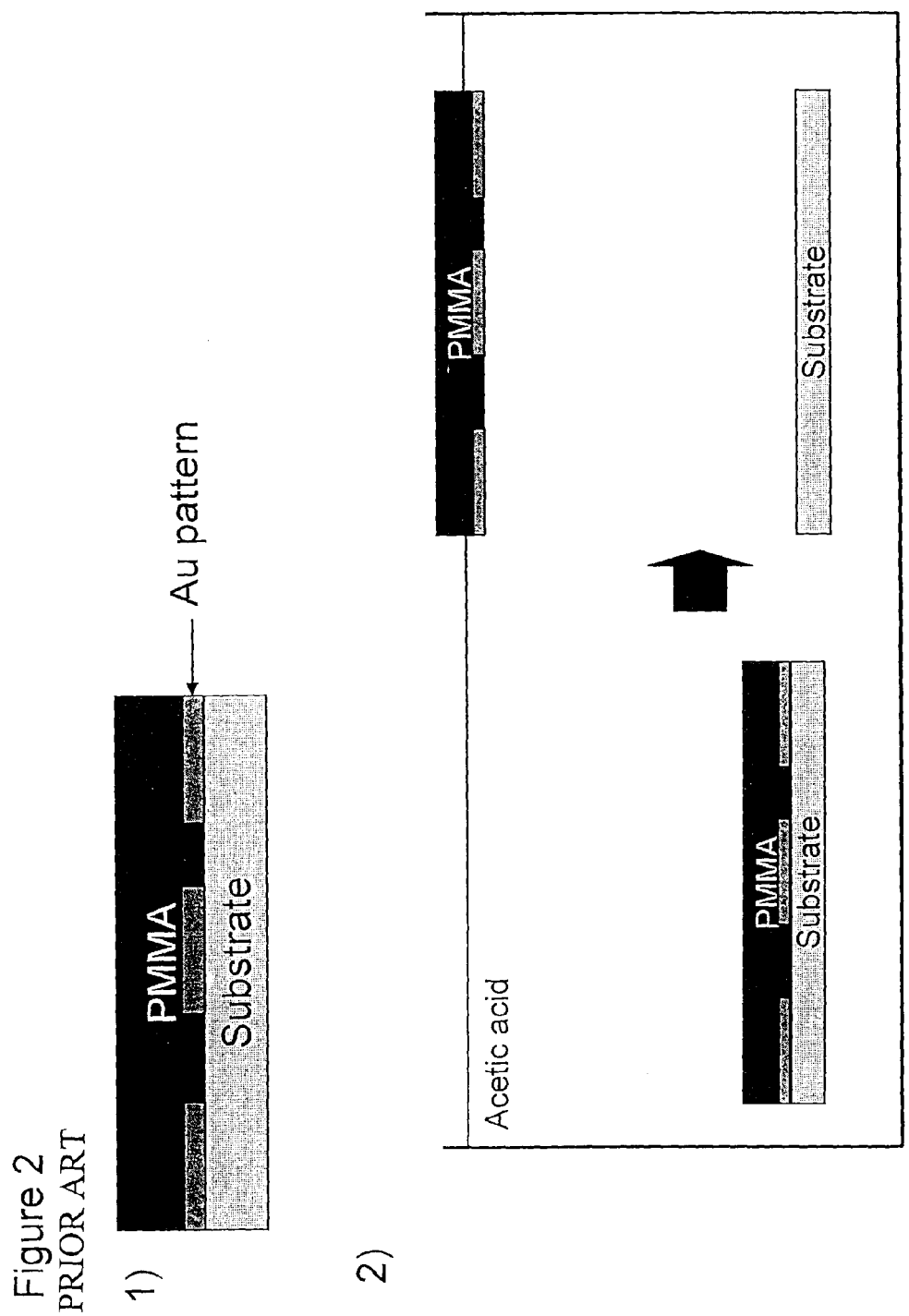
Figure 3A:
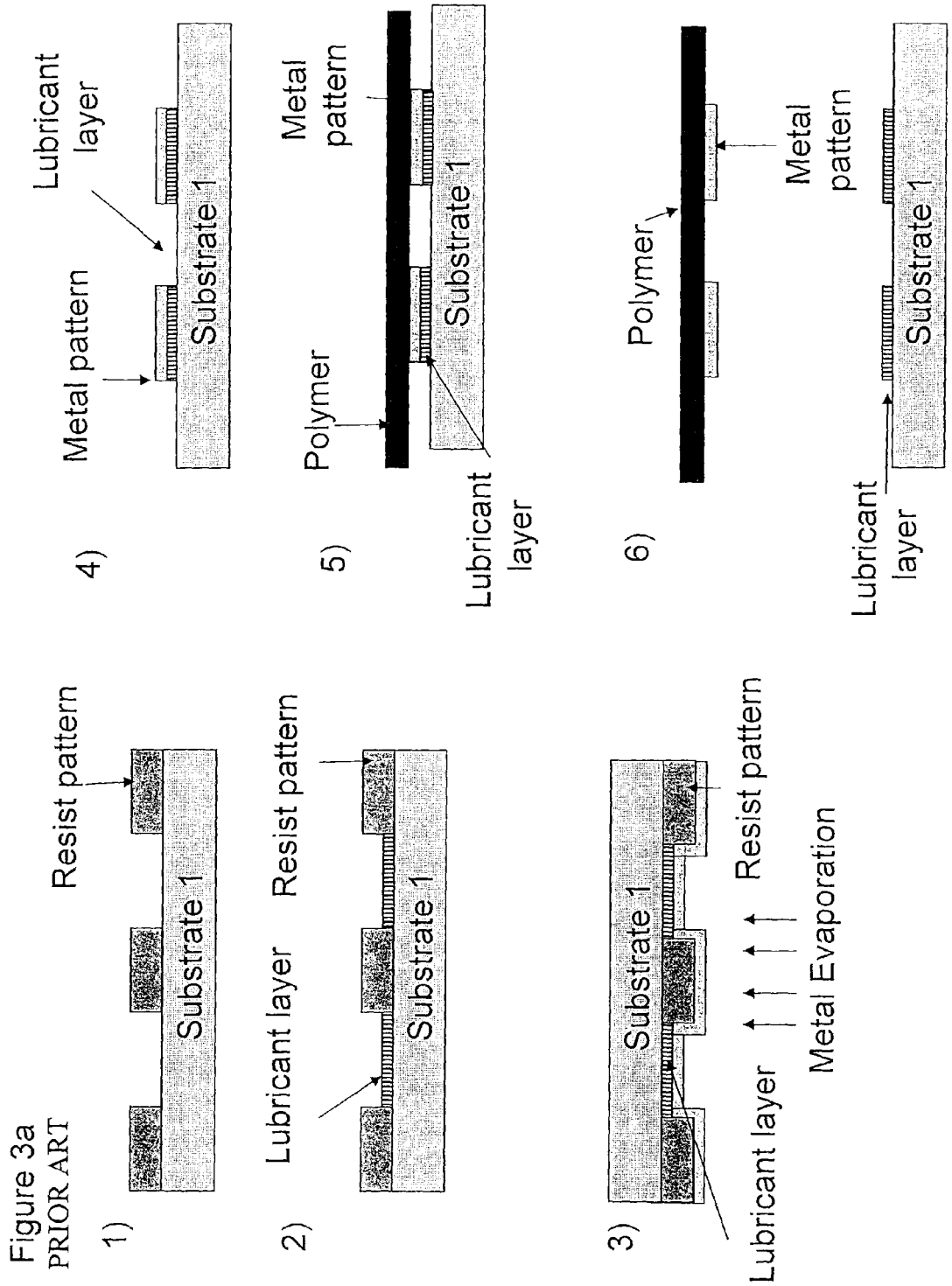
Figure 3B:
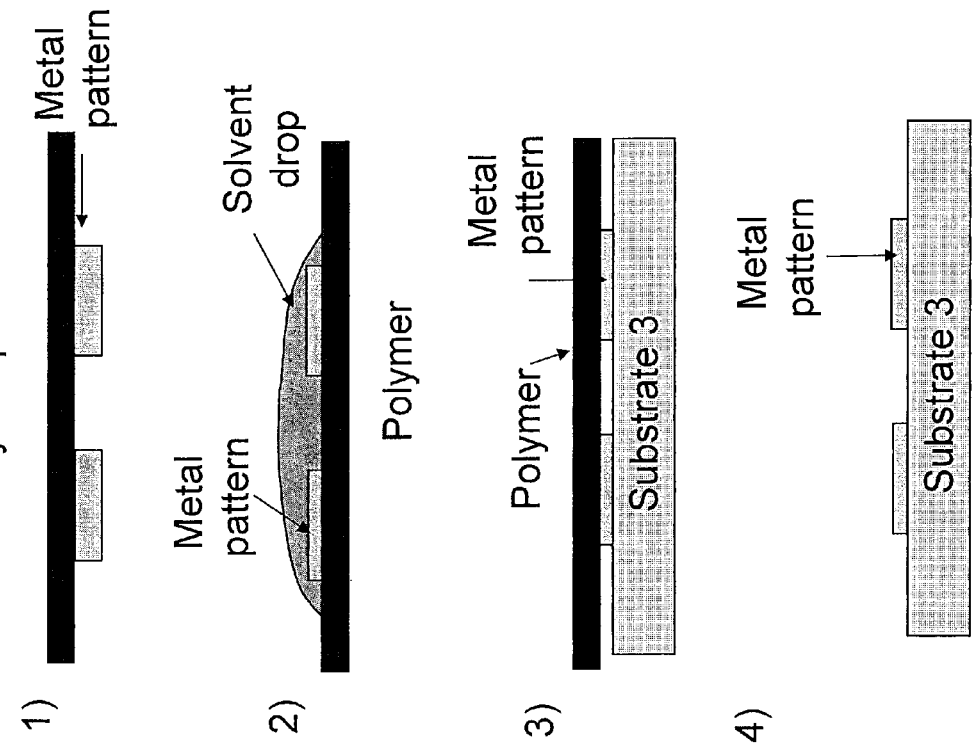
Figure 4A:
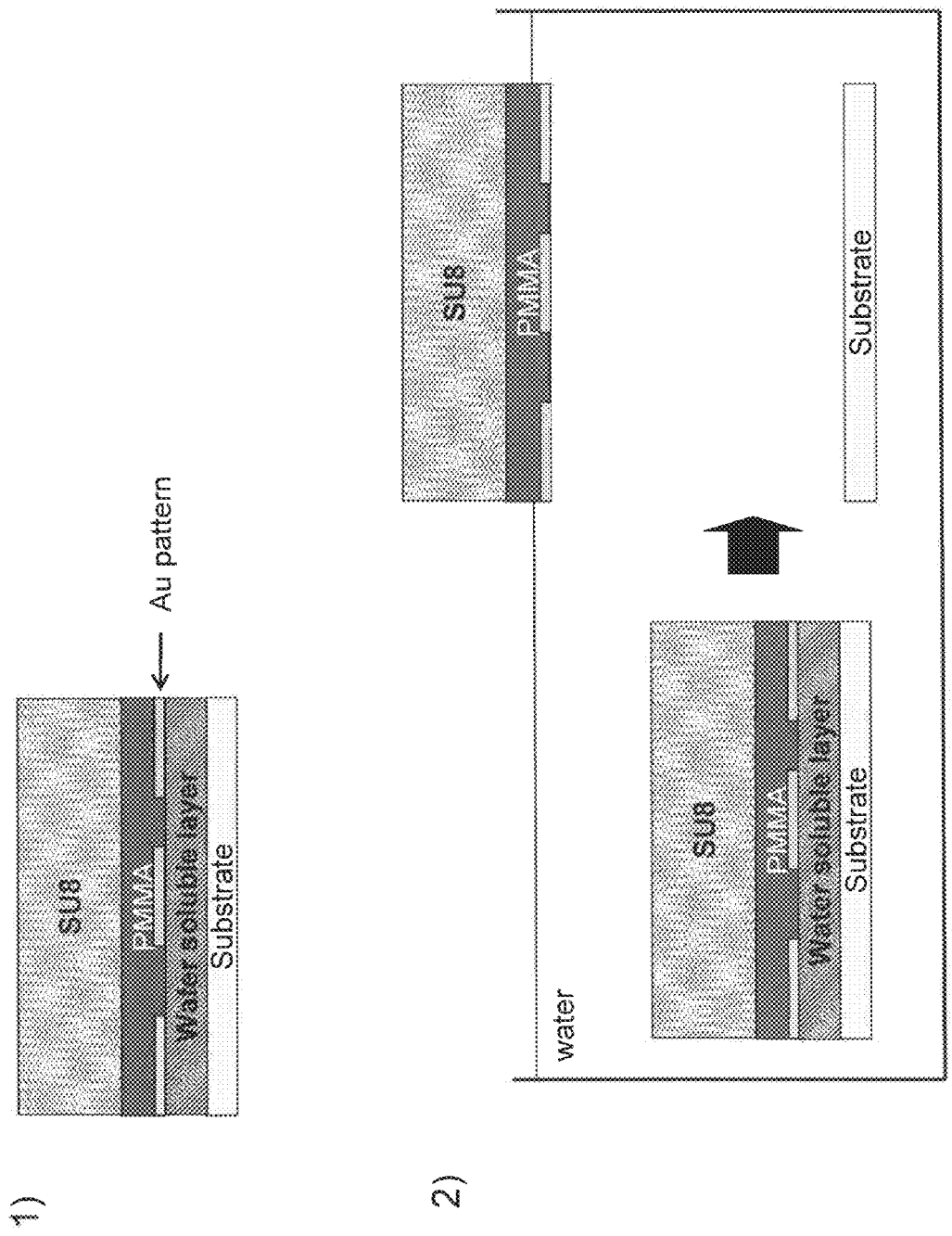
Figure 4B:
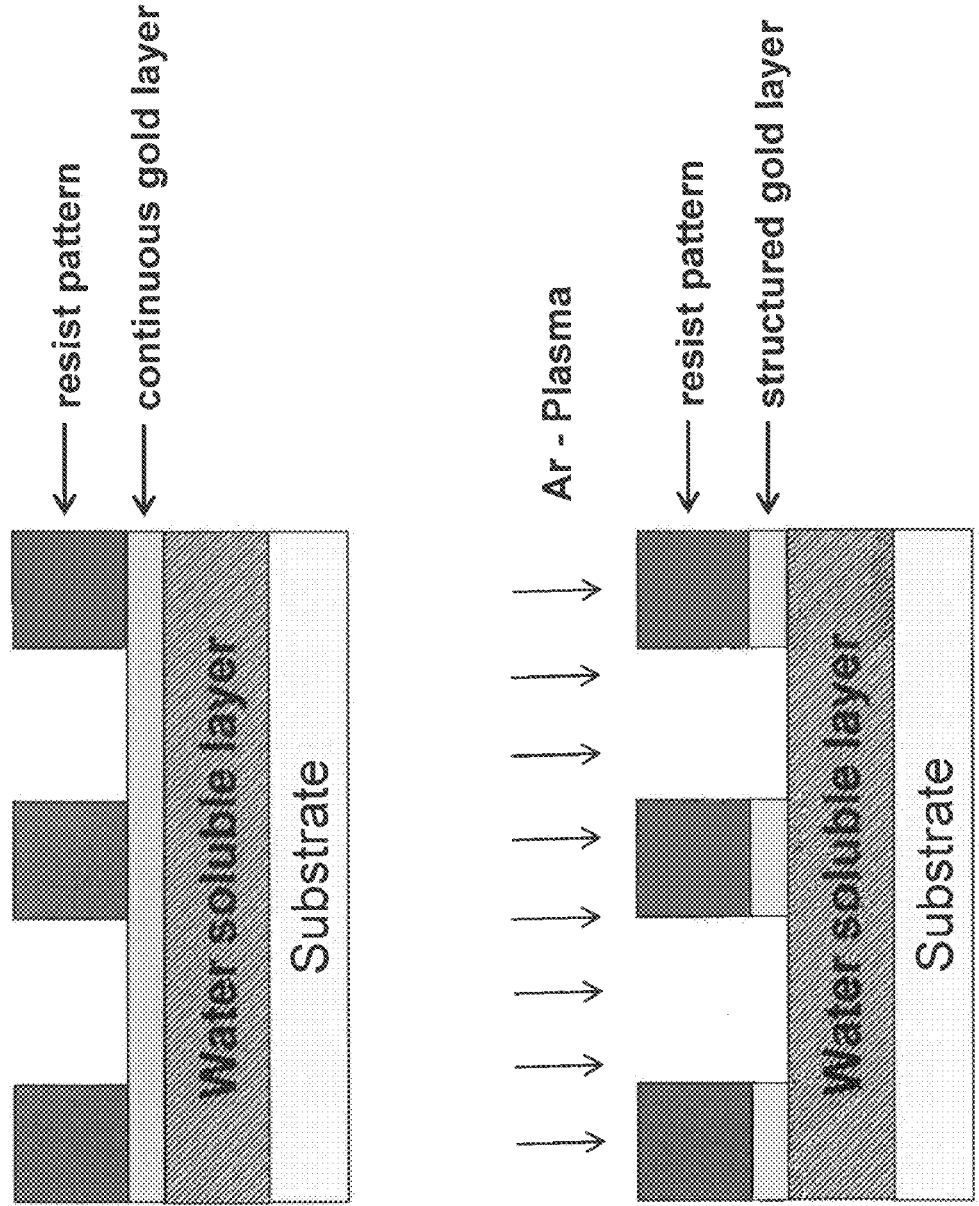
Figure 5:
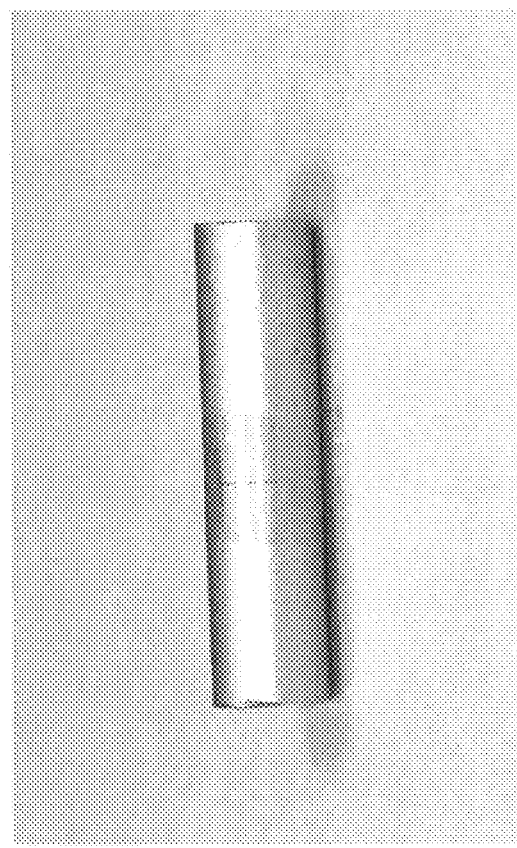
FIG. 5 shows structures, such as a metal bar and/or a metal cylinder onto which successfully a set of electrodes has been printed using the method according the present invention.
Figure 5:
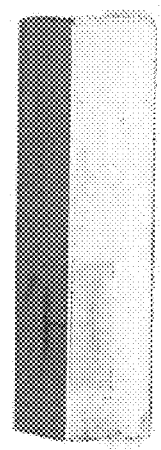

FIG. 5 shows the versatility of the printing process. The electrodes are prepared as follows: A thin layer of polyacrylic acid (PAA) is spin coated (at 4000 rpm) onto a native oxide silicon wafer. To remove remaining water in the PAA film, the sample is baked at 150° C. for 2 min. A 60 nm thick gold layer is deposited onto the PAA layer by physical vapor deposition and structured by the process described in FIG. 4*b*. Finally, a thin layer of PMMA (~100 nm) and SU8 (~1.5 μm) is spin coated onto the gold structures.

To print the electrodes, the samples are immersed in water until the PAA is completely dissolved and the electrodes detached from the substrate. The electrodes are then floated in a water bath onto a round or a quadratic shaped aluminium bar. FIG. 5 shows optical images of the printed electrodes.

Figure 6B:
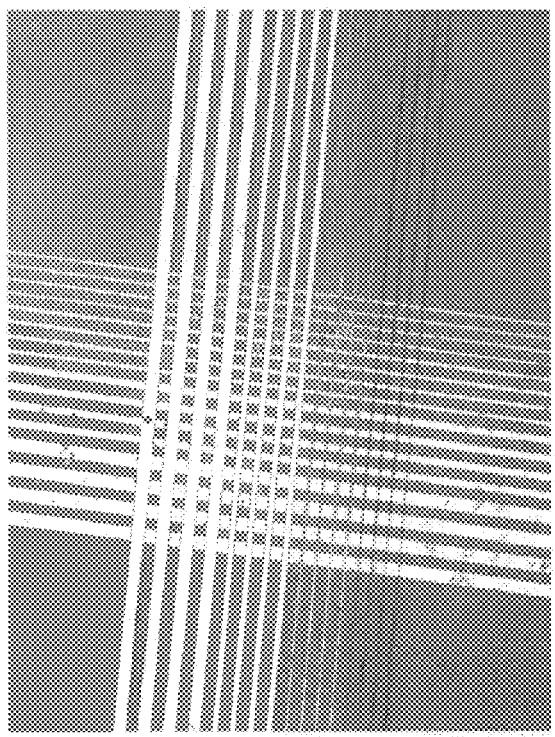
Figure 6A:
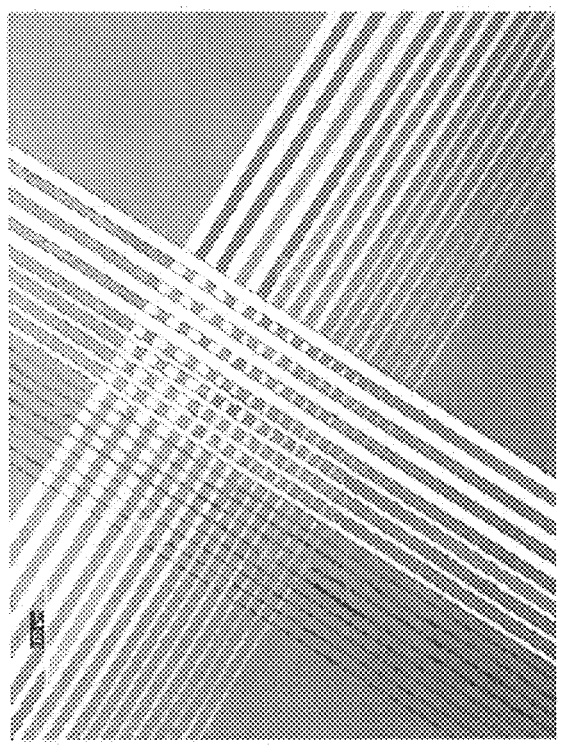
Figure 7:
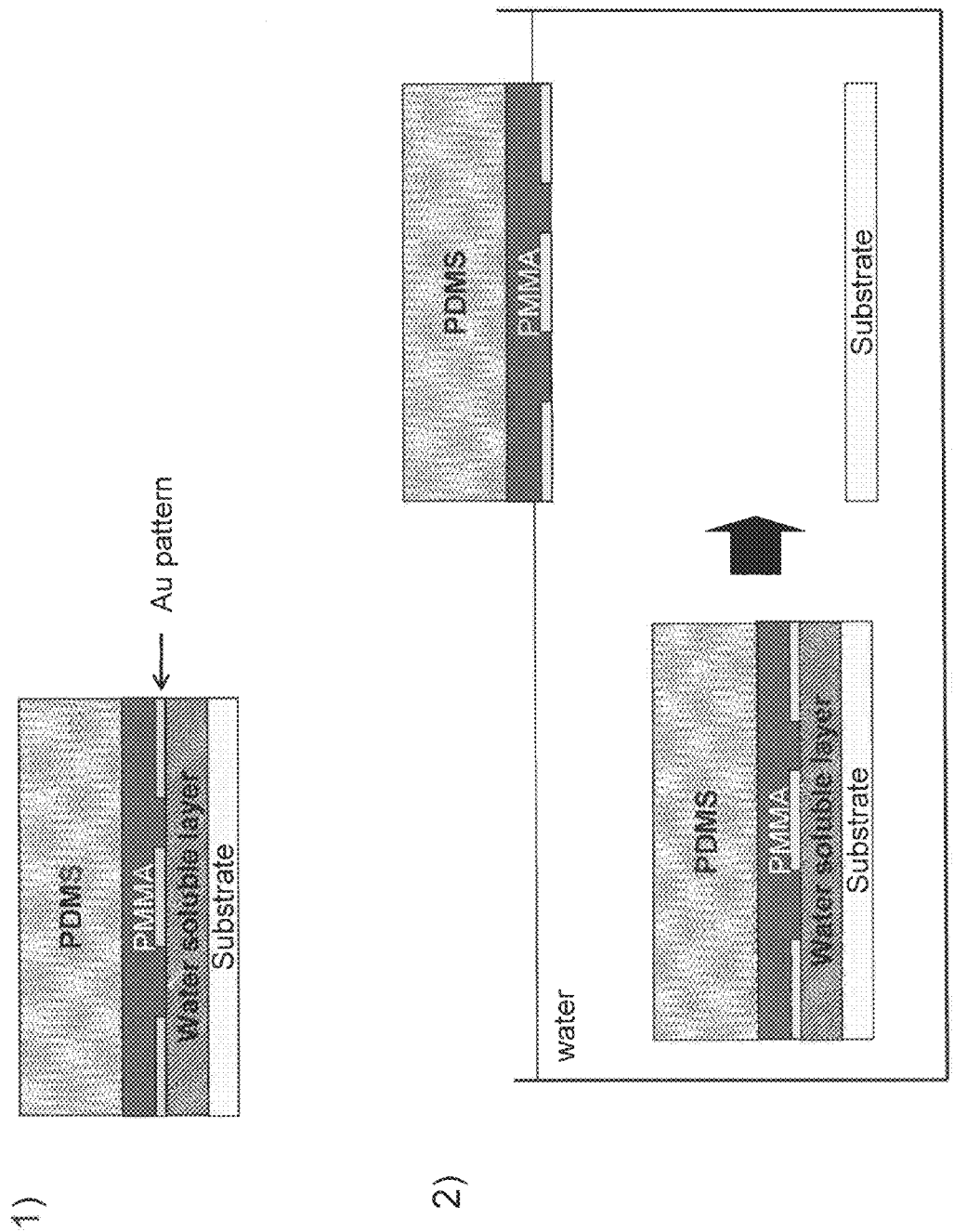
FIG. 7 shows another embodiment of a support layer in accordance with the present invention where the support layer is made of a polymeric material and has a thickness in the millimeter range; panels 1-4 show the various stages of the printing process.

FIG. 6 shows crossbar structures which were prepared by the same printing procedure as described in the explanation to FIG. 5. In contrast to FIG. 5, the top electrodes were printed onto gold (part a) or aluminium (part b) bottom electrodes. The bottom electrodes were deposited onto a silicon wafer with 300 nm SiO2 on top and structured by optical lithography. Both, the aluminium and gold bottom electrode is coated with a ~100 nm thick molecular layer, which has been deposited by physical vapor deposition.

Figure 8:
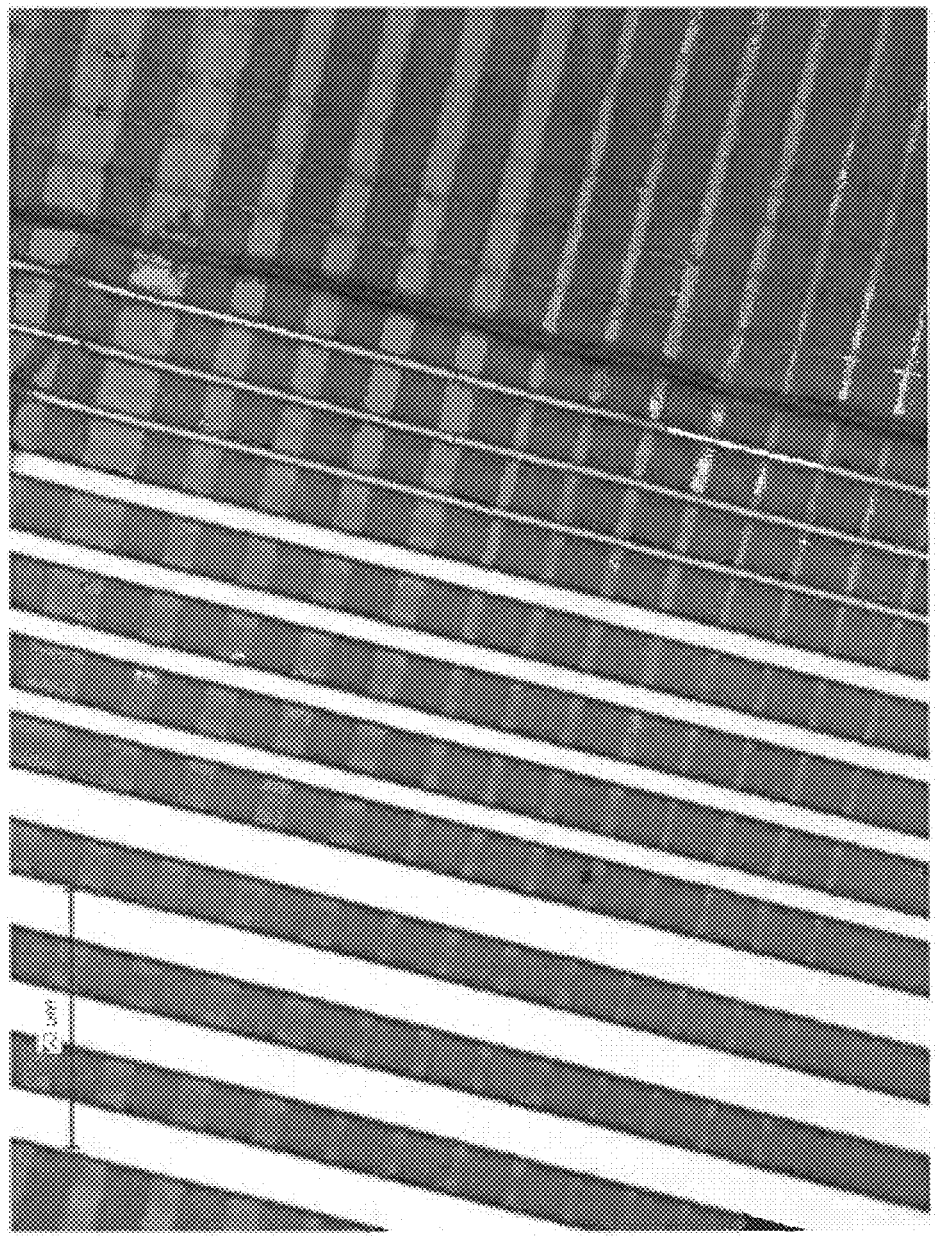

In FIG. 8 the SU8 layer is replaced by a thick (1-2 mm) PDMS layer. Otherwise, the same printing protocol as for FIG. 5 is used. The PDMS provides further stability so that the top electrodes can be removed from the water bath and aligned with the bottom electrode. FIG. 8 shows a gold bottom electrode, prepared by optical lithography, which is coated with molecular layers (deposited by self-assembly and vapor deposition). A gold top electrode is printed onto the molecular layer. Finally, after a drying step of approximately 24 h, the PDMS can be peeled of the substrate and the top electrode remains on the sample.

Figure 9:
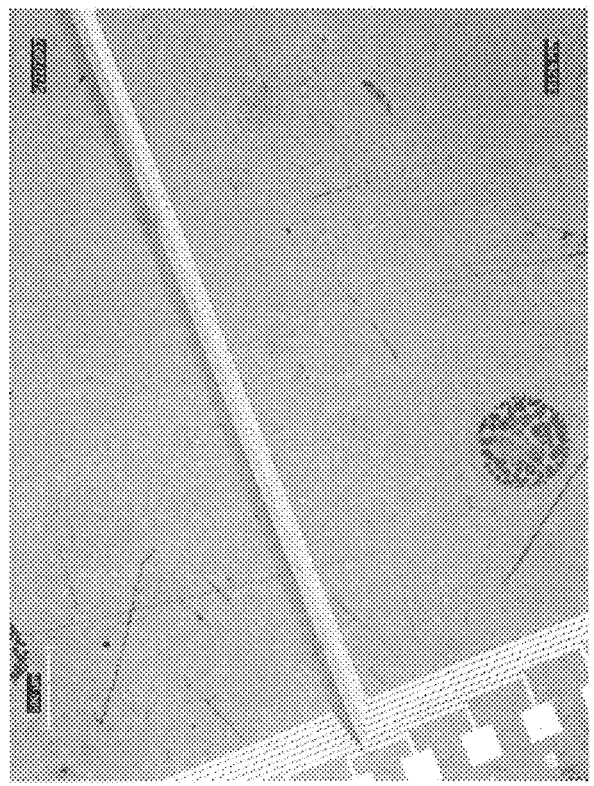
FIG. 9 shows a set of electrodes printed onto PES or PEN (polyether sulfone and Polyethylennaphtalate).
Figure 9:
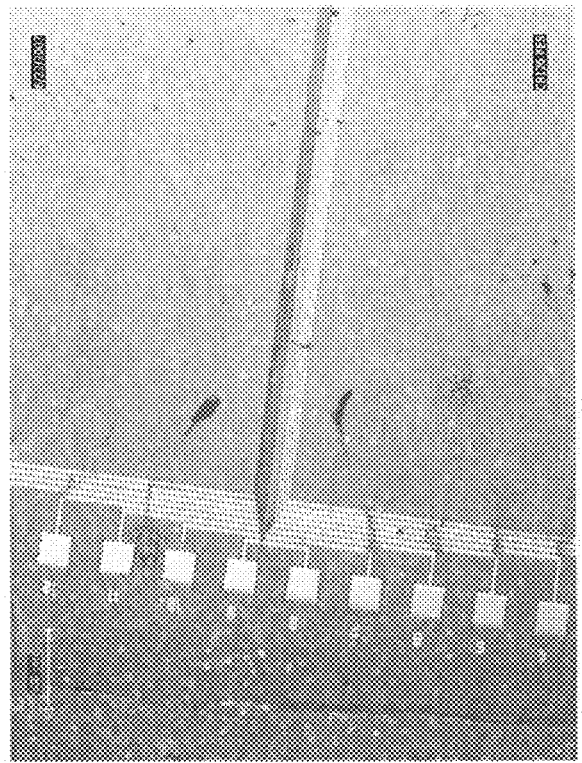

FIG. 9 shows that the technique can also print on flexible substrates. The same printing procedure as for FIG. 8 is used. Two different substrates were used, PES (polyether sulfone) and PEN (Polyethylennaphtalate). The electrodes were printed onto the plastic substrate outside the water bath and the PDMS is removed after a short drying step.

REFERENCE LIST

[1.] Y. N. Xia, G. M. Whitesides, *Annual Review of Materials Science* 1998, 28 153-184.

[2.] B. Michel, A. Bernard, A. Bietsch, E. Delamarche, M. Geissler, D. Juncker, H. Kind, J. P. Renault, H. Rothuizen, H. Schmid, P. Schmidt-Winkel, R. Stutz, H. Wolf, *Ibm Journal of Research and Development* 2001, 45 697-719.

[3.] J. W. P. Hsu, *Materials Today* 2005, July/August 42-54.

[4.] Y. L. Loo, D. V. Lang, J. A. Rogers, J. W. P. Hsu, *Nano Letters* 2003, 3 913-917.

[5.] Y. L. Loo, J. W. P. Hsu, R. L. Willett, K. W. Baldwin, K. W. West, J. A. Rogers, *Journal of Vacuum Science & Technology B* 2002, 20 2853-2856.

[6.] Loo, Y. L., Rogers, and J. A. U.S. Pat. No. 6,946,332 B2. Sep. 20, 2005. Ref Type: Patent
[7.] Y. L. Loo, T. Someya, K. W. Baldwin, Z. N. Bao, P. Ho, A. Dodabalapur, H. E. Katz, J. A. Rogers, *Proceedings of the National Academy of Sciences of the United States of America* 2002, 99 10252-10256.
[8.] Y. L. Loo, R. L. Willett, K. W. Baldwin, J. A. Rogers, *Journal of the American Chemical Society* 2002, 124 7654-7655.
[9.] D. R. Hines, S. Mezhenny, M. Breban, E. D. Williams, V. W. Ballarotto, G. Esen, A. Southard, M. S. Fuhrer, *Applied Physics Letters* 2005, 86 163101.
[10.] D. A. Bernards, T. Biegala, Z. A. Samuels, J. D. Slinker, G. G. Malliaras, S. Flores-Torres, H. D. Abruna, J. A. Rogers, *Applied Physics Letters* 2004, 84 3675-3677.
[11.] K. T. Shimizu, J. D. Tabbri, J. J. Jelincic, N. A. Melosh, *Advanced Materials* 2006, 18 1499-+.
[12.] E. Moons, M. Bruening, A. Shanzer, J. Beier, D. Cahen, *Synthetic Metals* 1996, 76 245-248.
[13.] Schwaab, D., RWTH Aachen, 2007.
[14.] V. Linder, B. D. Gates, D. Ryan, B. A. Parviz, G. M. Whitesides, *Small* 2005, 1 730-736.
[15.] M. Muhlberger, I. Bergmair, W. Schwinger, M. Gmainer, R. Schöftner, T. Glinsner, Ch. Hasenfuβ, K. Hingerl, M. Vogler, H. Schmidt, E. B. Kley, *Microelectronic Engineering* 2007, 84 925-927.

The features of the present invention disclosed in the specification, the claims and/or in the accompanying drawings, may, both separately, and in any combination thereof, be material for realising the invention in various forms thereof.

The invention claimed is:

1. A method of applying a pattern of metal, metal oxide, or semiconductor material on a substrate, the method comprising:
    a) providing a first substrate having a surface;
    b) coating said surface with a layer of water soluble material;
    c) creating a pattern of metal, metal oxide, or semiconductor material on said layer of water soluble material;
    d) covering said pattern of metal, metal oxide, or semiconductor material and said layer of water soluble material by a layer of polymeric material;
    e) covering said layer of polymeric material by a support layer;
    f) immersing said first substrate and the various layers on said first substrate, resulting from steps b)-e), in a bulk of water or in a bulk of aqueous solution until said layer of water soluble material is substantially dissolved, such that an assembly consisting of said support layer, said layer of polymeric material and said pattern of metal, metal oxide, or semiconductor material is detached from said first substrate; and
    g) bringing said pattern of metal, metal oxide, or semiconductor material of said assembly in conformal contact with a second substrate, and optionally leaving it in contact for a defined period of time with said second substrate, said time being in the range of from 10 s to 48 h, thereby applying said pattern of metal, metal oxide, or semiconductor material with the layer of polymeric material on it onto said second substrate,
    wherein said support layer is made of a polymeric material selected from polydimethyl siloxane (PDMS), polyolefinic plastic (POP) and ionomeric polymers,
    wherein step g) is performed by removing said assembly resulting from step 1) out of said bulk of water or said bulk of aqueous solution and bringing said pattern of metal, metal oxide, or semiconductor material in conformal contact with said second substrate, and
    wherein, in step g), said pattern of metal, metal oxide, or semiconductor material is aligned with said second substrate before or while bringing it in conformal contact with said second substrate, wherein said alignment is achieved using marker patterns or moiré patterns on said second substrate and said layer of polymeric material and said alignment is achieved using an alignment apparatus.

2. The method according to claim 1, further comprising:
    h) removing said support layer from said layer of polymeric material.

3. The method according to claim 2, further comprising:
    i) removing said layer of polymeric material.

4. The method according to any one of the preceding claims, wherein said polymeric material is selected from the group consisting of polyesters of carboxylic acids, polyanhydrides of carboxylic acids, polycarbonates and mixtures of any of the foregoing.

5. The method according to claim 1, wherein said polymeric material is selected from the group consisting of polymethylmethacrylate (PMMA), polyethylene terephthalate, cellulose acetate and poly(oxycarbonyloxo-1,4-phenylene-isopropylidene-1,4-phenylene)(polycarbonate).

6. The method according to claim 1, wherein said polymeric material is polymethylmethacrylate (PMMA).

7. The method according to claim 1, wherein said water soluble material is selected from the group consisting of polyacrylic acid, polyvinyl alcohol and polyacrylamide.

8. The method according to claim 1, wherein step c) is performed by optical lithography, nano-imprint lithography, UV nano-imprint lithography, e-beam lithography, or soft lithography.

9. The method according to claim 8, wherein step c) is performed by optical lithography.

10. The method according to claim 8, wherein step c) is performed by the following sequence of substeps:
    ca) applying a layer of metal, metal oxide, or semiconductor material on said layer of a water soluble material,
    cb) creating a resist pattern on said layer of metal, metal oxide, or semiconductor material,
    cc) removing said layer of metal, metal oxide, or semiconductor material in positions which are not covered by said resist pattern, by means of an etching technique, and, optionally,
    cd) removing said resist pattern to leave behind a pattern of metal, metal oxide, or semiconductor material on said layer of water soluble material.

11. The method according to claim 2, wherein step f) is performed by placing said first substrate and the various layers on it, resulting from steps b)-e), in said bulk of water or said bulk of aqueous solution and soaking it for a period of from 1 s to 3 h.

12. The method according to claim 1, wherein said support layer is made of a resist material.

13. The method according to claim 11, wherein step g) is performed by placing said second substrate in said bulk of water or said bulk of aqueous solution and bringing said pattern of metal, metal oxide, or semiconductor material in conformal contact with said second substrate in said bulk of water or said bulk of aqueous solution, and optionally performing step h) by etching.

14. The method according to claim 12, wherein said support layer has a thickness of from 100 nm-10 μm.

15. The method according to claim 12, wherein said second substrate has a curved or bent surface or a surface with an edge and is covered with a structured bottom electrode and a layer of organic material, onto which surface said pattern of metal, metal oxide, or semiconductor material is to be applied.

16. The method according to claim 3, wherein step h) is performed by drying said pattern of metal, metal oxide, or semiconductor material applied in step g) for a defined period of time, said time being in the range of from 10 s to 48 h, and thereafter peeling off said support layer from said layer of polymeric material.

17. The method according to claim 16, wherein step i) is performed by etching.

18. The method according to claim 16, wherein said support layer has a thickness of 500 µm-10 mm.

19. The method according to claim 1, wherein said layer of water soluble material has a thickness in the range of from 10 nm to 1 µm.

20. The method according to claim 1, wherein said layer of polymeric material has a thickness in the range of from 20 nm to 1 µm.

21. The method according to claim 10, wherein said layer of metal, metal oxide, or semiconductor material has a thickness in the range of from 1 nm to 500 nm.

22. The method according to claim 1, wherein said metal is selected from the group consisting of Au, Ti, Pt, Ag, Cr, Cu, and Al, and said metal oxide is selected from the group consisting of $Al_2O_3$, AgO, $TiO_2$, and $SiO_2$, and said semiconductor material is selected from the group comprising consisting of Si, Ge, GaAs, GaN, InSb, InP, CdS, and ZnSe.

23. The method according to claim 1, wherein said first substrate is made of a material selected from the group consisting of single crystalline materials, polycrystalline materials, GaAs, Si, $SiO_2$, mica, amorphous composites, glass, float glass, and perovskites.

24. The method according to claim 1, wherein said first substrate is made of silicon.

25. The method according to claim 1, wherein said metal is Au or Al.

26. The method according to claim 1, wherein said second substrate is structured with bottom electrodes and has a molecular layer on a surface, and said pattern of metal, metal oxide, or semiconductor material is applied on said surface in step g) of the method according to claim 1.

27. The method according to the claim 26, wherein said molecular layer is a layer of semiconducting organic molecules, polymers or a self-assembled monolayer.

28. The method according to claim 11, wherein said soaking occurs for a period of from 1 min to 30 min.

29. The method according to claim 11, wherein said soaking occurs at a temperature in the range of from 10° C. to 90° C.

30. The method according to claim 12, wherein said resist material is selected from photoresists.

31. The method according to claim 13, wherein step h) is performed by plasma etching.

32. The method according to claim 14, wherein said support layer has a thickness of from 1 µm-2 µm.

33. The method according to claim 17, wherein step i) is performed by oxygen plasma etching.

34. The method according to claim 18, wherein said support layer has a thickness of 1 mm-5 mm.

35. The method according to claim 19, wherein said layer of water soluble material has a thickness in the range of from 100 nm to 500 nm.

36. The method according to claim 20, wherein said layer of polymeric material has a thickness in the range of from 100 nm to 500 nm.

37. The method according to claim 21, wherein said layer of metal, metal oxide, or semiconductor material has a thickness in the range of from 5 nm to 200 nm.

* * * * *